United States Patent
He et al.

(10) Patent No.: US 7,589,414 B2
(45) Date of Patent: *Sep. 15, 2009

(54) I/O ARCHITECTURE FOR INTEGRATED CIRCUIT PACKAGE

(75) Inventors: Jiangqi He, Gilbert, AZ (US);
Yuan-Liang Li, Chandler, AZ (US);
Michael Walk, Mesa, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/953,467

(22) Filed: Dec. 10, 2007

(65) Prior Publication Data

US 2008/0088009 A1    Apr. 17, 2008

Related U.S. Application Data

(60) Continuation of application No. 11/063,963, filed on Feb. 23, 2005, now Pat. No. 7,329,946, which is a division of application No. 10/657,686, filed on Sep. 8, 2003, now Pat. No. 6,897,556.

(51) Int. Cl.
*H01L 23/48* (2006.01)
*H01L 23/52* (2006.01)

(52) U.S. Cl. .............. 257/693; 257/697; 257/698; 257/778; 257/E23.067

(58) Field of Classification Search .......... 257/693, 257/697, 698, 778, E23.067
See application file for complete search history.

(56) References Cited

U.S. PATENT DOCUMENTS

| | | | |
|---|---|---|---|
| 3,612,744 A | 10/1971 | Thomas | |
| 3,757,029 A | 9/1973 | Marshall | |
| 3,993,936 A | 11/1976 | Meade et al. | |
| 5,751,553 A | 5/1998 | Clayton | |
| 6,347,039 B1 | 2/2002 | Lee | |
| 6,776,658 B2 | 8/2004 | Tang | |
| 6,809,608 B2 | 10/2004 | Fjelstad | |
| 6,884,120 B1 | 4/2005 | Haba et al. | |
| 7,015,570 B2 * | 3/2006 | Emma et al. | 257/685 |
| 7,173,329 B2 * | 2/2007 | Frutschy et al. | 257/698 |
| 7,307,293 B2 * | 12/2007 | Fjelstad et al. | 257/200 |
| 7,321,167 B2 * | 1/2008 | Zhong et al. | 257/701 |
| 2002/0160598 A1 * | 10/2002 | Kong | 438/613 |
| 2004/0004822 A1 | 1/2004 | Ruckerbauer et al. | |

OTHER PUBLICATIONS

Mahajan, Ravie et al., "The Evolution of Microprocessor Packaging", Intel Technology Journal Q3, 2000. 10pgs.

(Continued)

*Primary Examiner*—Nitin Parekh
(74) *Attorney, Agent, or Firm*—Buckley, Maschoff & Talwalkar LLC

(57) ABSTRACT

A circuit package may include an upper surface of first conductive elements and second conductive elements. The first conductive elements may receive input/output signals from respective conductive elements of an integrated circuit die, and the second conductive elements may receive a first plurality of the input/output signals from respective ones of the first conductive elements. A lower surface of the package may include third conductive elements, the third conductive elements to receive a second plurality of the input/output signals from respective other ones of the first conductive elements.

11 Claims, 5 Drawing Sheets

OTHER PUBLICATIONS

Lii, Mirng-Ji et al., "Flip-Clip Technology on Organic Pin Grid Array Packages", Intel Technology Journal Q3, 2000. 9pgs.

Polka, Lesley et al., "Package-Level Interconnect Design for Optimum Electrical Performance", Intel Technology Journal Q3, 2000. 17pgs.

Marshall, Donald E. et al., "VAX9000 Packaging - The Multi Chip Unit", Digital Equipment Corporation, 1990 IEEE, CH2843-1/90/0000/0054, pp. 54-57, total 4 pages.

* cited by examiner

I/O ARCHITECTURE FOR INTEGRATED CIRCUIT PACKAGE

CROSS REFERENCE TO RELATED APPLICATION

This is a continuation of U.S. patent application Ser. No. 11/063,963, filed Feb. 23, 2005, which is a divisional of U.S. patent application Ser. No. 10/657,686, filed Sep. 8, 2003, now U.S. Pat. No. 6,897,556, issued May 24, 2005.

BACKGROUND

System performance may be improved by increasing the quality of I/O signals transmitted between an integrated circuit die and associated receivers. The previously-proposed Decoupled I/O, Power delivery Hybrid (DIPH) architecture attempts to increase this quality by disposing I/O signal connections on the perimeter of a die and by disposing power connections on the interior of the die. The die may therefore receive power signals through pins and vias within a package holding the die, while I/O signals may be received through a cable connected to conductive elements disposed on an upper surface of the package that are in turn connected to the perimeter of the die.

DETAILED DESCRIPTION

Figure 1:
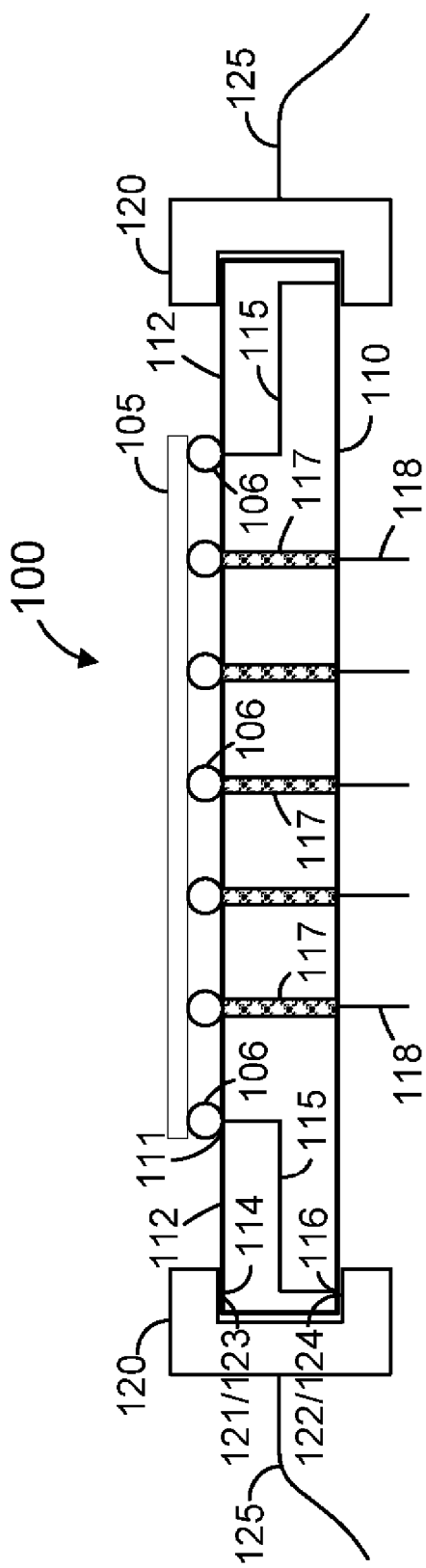
FIG. 1 is a cutaway side elevation of a system according to some embodiments.

FIG. 1 is a side elevation of system 100 according to some embodiments. System 100 includes integrated circuit die 105. Integrated circuit die 105 may be fabricated using any suitable substrate material and fabrication technique and may provide any functions. In some embodiments, integrated circuit die 105 is a microprocessor chip having a silicon substrate.

Die 105 is electrically coupled to solder bumps 106, which are in turn coupled to an upper surface of package 110. Solder bumps 106 may comprise Controlled Collapse Chip Connect (C4) solder bumps, and may be coupled to a surface of die 105 that includes active devices in a "flip-chip" arrangement. Package 110 may comprise any ceramic, organic, and/or other suitable material including an interface compatible with solder bumps 106. In some embodiments, package 110 is electrically coupled to die 105 via wirebonds in addition or as an alternative to solder bumps 106.

As shown, some of solder bumps 106 are coupled to conductive elements 111. In some embodiments, conductive elements 111 receive I/O signals from respective solder bumps 106 to which they are coupled. Conductive elements 111 may be disposed above and/or flush with the upper surface or package 110. Conductive elements 111 may comprise any conductive structure for achieving an electrical connection with respective solder bumps 106, such as a copper pad with nickel and/or gold plating. Conductive elements 111 according to some embodiments are illustrated in FIG. 2, which is a top view of system 100 without die 105.

The upper surface of package 110 also includes fan-out areas 112. FIG. 2 shows fan-out areas 112 in some detail. In particular, FIG. 2 shows electrical couplings 113a and 113b within fan-out areas 112. Electrical couplings 113a electrically couple each of conductive elements 111 to a respective one of conductive elements 114. Accordingly, conductive elements 114 may receive I/O signals from respective ones of conductive elements 111 to which they are coupled. Electrical couplings 113a may comprise copper microstriplines, and conductive elements 114 may comprise any suitable conductive connection element.

Figure 2:
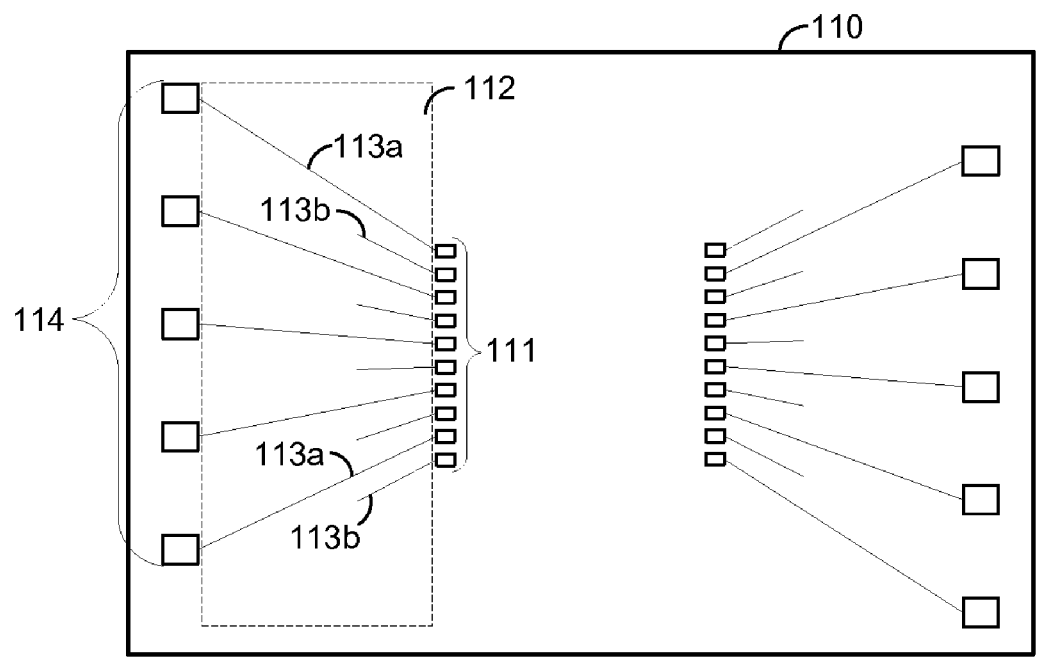
FIG. 2 is a top view of a package according to some embodiments.

As shown in FIG. 2, a footprint of conductive elements 111 may be smaller than a footprint of conductive elements 114. Such an arrangement may facilitate the connection of a connector to elements 114 due to the increase in spacing between conductive elements.

Figure 3:
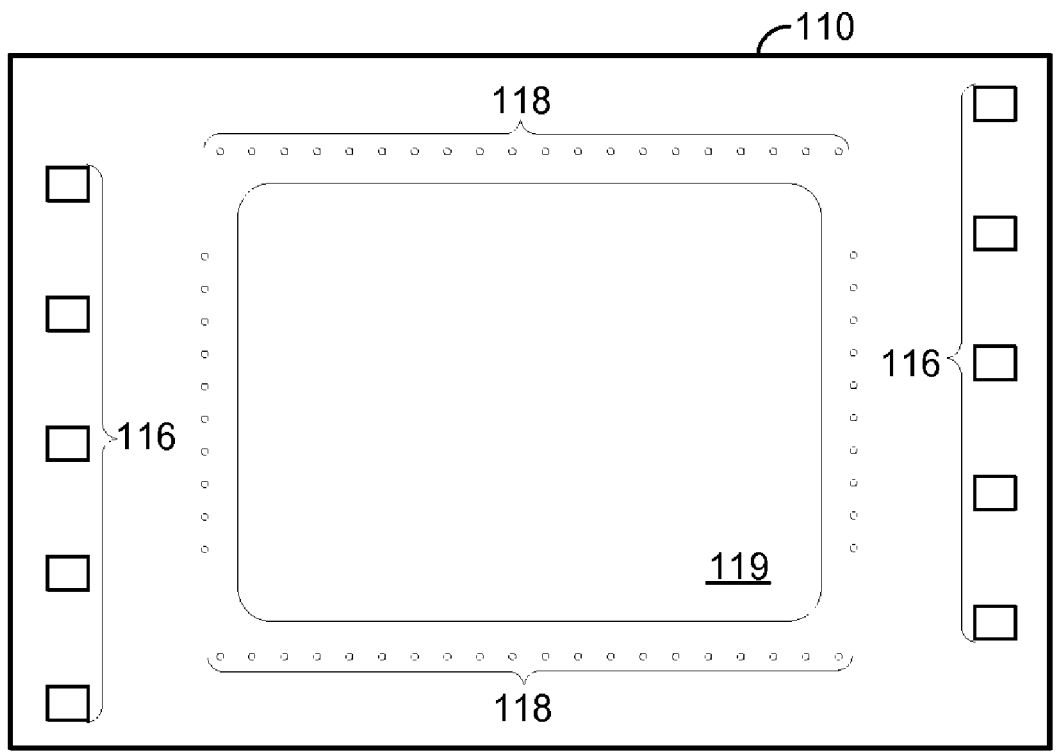
FIG. 3 is a bottom view of a package according to some embodiments.

Electrical couplings 113b may also comprise microstriplines. Couplings 113b may be coupled to vias 115 that vertically traverse package 110. Vias 115 may in turn be electrically coupled to conductive elements 116 disposed on and/or flush with a lower surface of package 110. FIG. 3 is a bottom view of package 110 showing conductive elements 116. Conductive elements 116 may receive I/O signals from respective ones of conductive elements 111 to which they are coupled through associated vias 115. For a given number of conductive elements 111, the routing of I/O signals to an upper and lower surface of package 110 may allow the use of an I/O connection to package 110 that has a greater conductor pitch than previously usable.

Package 110 also includes pin-through holes 117 for coupling pins 118 to die 105. Pins 118 are interface elements for mounting system 100 to a socket on a motherboard or directly to a motherboard. Pins 118 carry power and ground signals to die 105 according to some embodiments. Other interface elements such as solder bumps may be used in place of or in addition to pins 118. According to some embodiments, package 110 is a surface-mountable substrate such as an Organic Land Grid Array substrate that may be mounted directly on a motherboard or mounted on a pinned interposer which mates with a socket of a motherboard. Packaging systems other than those mentioned above may be used in conjunction with some embodiments.

In some embodiments, pins 118 are disposed around the perimeter of recess 119 of package 110 as shown in FIG. 3. Land-side capacitors may be mounted in recess 119 to assist the functionality of die 105 and/or to reduce resonance between system 100 and a board to which system 100 is mounted.

Connector 120 may be mechanically coupled to package 110 using any suitable currently or hereafter-known system. Connector 120 includes coupling surface 121 and coupling surface 122, which face one another. Coupling surface 121 includes conductive elements 123 which are received by respective ones of conductive elements 114 when connector 120 is connected to package 110. Similarly, coupling surface 122 includes conductive elements 124 which are received by respective ones of conductive elements 114 when connector 120 is connected to package 110.

Connector 120 is coupled to cable 125. In some embodiments, conductive elements 123 are electrically coupled to respective ones of conductors within upper surface 126 of cable 125, and conductive elements 124 are electrically coupled to respective ones of conductors within lower surface 127 of cable 125. Accordingly, conductive elements 111 are electrically coupled to respective ones of conductors within upper surface 126 and other ones of conductive elements 111 are electrically coupled to respective ones of conductors within lower surface 127.

Figure 4:
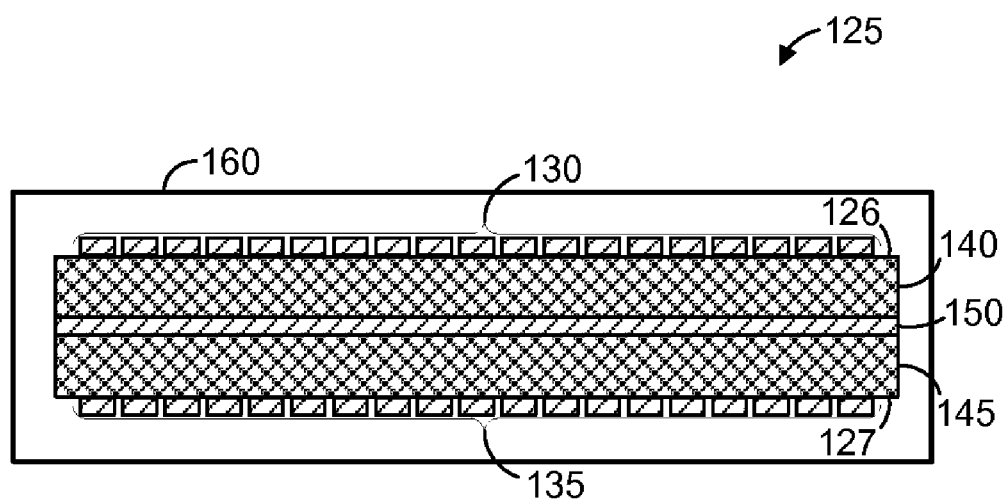
FIG. 4 is a cutaway view of a cable according to some embodiments.

FIG. 4 is a cut-away view of cable 125 according to some embodiments. Shown are upper surface 126 and lower surface 127. Upper surface 126 includes a set of conductors 130 and lower surface 127 includes a set of conductors 135. Conductors 130 may be formed as copper striplines within dielectric substrate 140. Similarly, conductors 130 may be formed as copper striplines within dielectric substrate 145. Middle conductor 150 is sandwiched between substrate 140 and substrate 145 so as to be electrically isolated from conductors 130 and conductors 135. Middle conductor 150 may also comprise copper or any other suitable materials. Conductors 130, 135 and 140 need not be fabricated from identical or similar materials.

Each of conductors 130 is electrically couplable to respective ones of conductive pads 111. In particular, each of conductors 130 is couplable to respective ones of conductive elements 123, which are couplable to respective ones of conductive elements 114, which are electrically coupled to respective ones of conductive pads 111. Similarly, each of conductors 135 is electrically couplable to respective other ones of conductive pads 111 via conductive elements 124 and conductive elements 116.

Housing 160 provides a protective covering for the other components of cable 125. Housing 160 may also physically couple conductors 130 to conductors 135 while electrically isolating conductors 130 and conductors 135 from one another.

Figure 5:
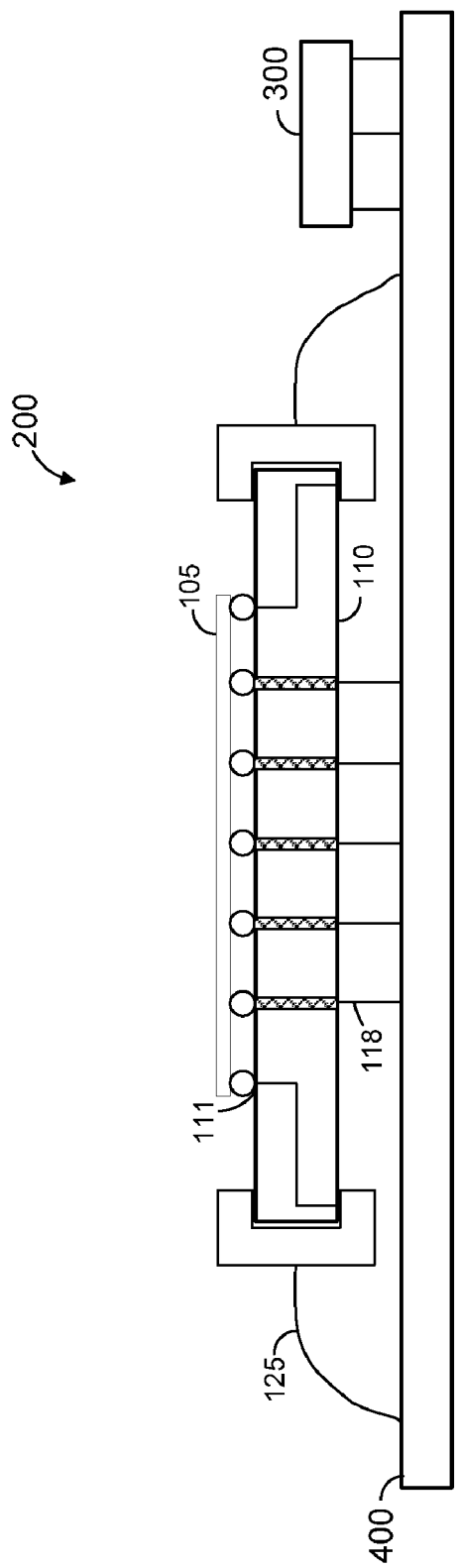
FIG. 5 is a side elevation of a system according to some embodiments.

FIG. 5 illustrates a system according to some embodiments. System 200 includes system 100 of FIG. 1, memory 300 and motherboard 400. System 200 may comprise components of a desktop computing platform. Memory 300 may comprise any type of memory for storing data, such as a Single Data Rate Random Access Memory, a Double Data Rate Random Access Memory, or a Programmable Read Only Memory.

Memory 300 and motherboard 400 may be electrically coupled to package 110 of system 100. More particularly, motherboard 400 may comprise a memory bus (not shown) coupled to cable 125 and to memory 300. In operation, motherboard 400 may route input/output signals to cable 125 for transmission to conductive pads 111 and may route power and ground signals to pins 118.

The several embodiments described herein are solely for the purpose of illustration. In some embodiments, one or more instances of cable 125 are connected to a single side of package 110 using one or more instances of connector 120. Moreover, one or more of the four sides of package 110 may be connected to at least one cable 125 according to some embodiments. Some embodiments do not require a one-to-one relationship between conductive pads 111 and conductive pads 114, between conductive pads 111 and conductive pads 116, between conductive pads 114 and conductive pads 123, between conductive pads 116 and conductive pads 124, between conductive pads 123 and conductors 130, and between conductive pads 124 and conductors 135. Some embodiments may include any currently or hereafter-known versions of the elements described herein. Therefore, persons skilled in the art will recognize from this description that other embodiments may be practiced with various modifications and alterations.

What is claimed is:

1. A device comprising:
an integrated circuit package, the integrated circuit package comprising:
an upper surface comprising first conductive elements and second conductive elements, the first conductive elements to receive input/output signals from respective conductive elements of an integrated circuit die, and the second conductive elements to receive a first plurality of the input/output signals from respective ones of the first conductive elements; and
a lower surface comprising interface elements to electrically couple the integrated circuit package to a circuit board and third conductive elements, the third conductive elements to receive a second plurality of the input/output signals from respective other ones of the first conductive elements;
wherein the interface elements are to carry power and ground signals to the integrated circuit die;
wherein the respective other ones of the first conductive elements are not received by the second conductive elements;
wherein each of the second conductive elements is to receive a respective one of fourth conductive elements, the fourth conductive elements disposed on a first coupling surface of a connector, and
wherein each of the third conductive elements is to receive a respective one of fifth conductive elements, the fifth conductive elements disposed on a second coupling surface of the connector.

2. A device according to claim 1, wherein a first electrical coupling between one of the second conductive elements and a respective one of the first conductive elements comprises a microstripline, and
wherein a second electrical coupling between one of the third conductive elements and a respective other one of the first conductive elements comprises a microvia.

3. A device according to claim 1, wherein the first coupling surface and the second coupling surface face one another.

4. A device according to claim 1, wherein the fourth conductive elements are connected to conductors within an upper surface of a cable coupled to the connector, and
wherein the fifth conductive elements are connected to conductors within an lower surface of the cable.

5. A device according to claim 1, wherein a footprint of the first conductive elements is smaller than a footprint of the second conductive elements.

6. A device according to claim 5, wherein the footprint of the first conductive elements is smaller than a footprint of the third conductive elements.

7. A system comprising:
an integrated circuit package comprising:
an upper surface comprising first conductive elements and second conductive elements, the first conductive elements to receive input/output signals from respective conductive elements of an integrated circuit die, and the second conductive elements to receive a first plurality of the input/output signals from respective ones of the first conductive elements; and
a lower surface comprising interface elements to electrically couple the integrated circuit package to a circuit board and third conductive elements, the third conductive elements to receive a second plurality of the input/output signals from respective other ones of the first conductive elements, wherein the interface elements are to carry power and ground signals to the integrated circuit die, and wherein the respective other ones of the first conductive elements are not received by the second conductive element;
a double data rate memory electrically coupled to the package; and a connector comprising:
  an upper connector surface having fourth conductive elements disposed thereon, the fourth conductive elements to receive respective ones of the second conductive elements; and
  a lower connector surface having fifth conductive elements disposed thereon, the fifth conductive elements to receive respective ones of the third conductive elements.

8. A system according to claim 7, further comprising:
an integrated circuit die comprising die conductive elements, one of the die conductive elements electrically coupled to one of the second conductive elements of the package, and another one of the die conductive elements electrically coupled to one of the third conductive elements of the package.

9. A system according to claim 8, further comprising:
a cable comprising a first set of conductors connected to respective ones of the fourth conductive elements and a second set of conductors connected to respective ones of the fifth conductive elements.

10. A system according to claim 9, further comprising:
a motherboard coupled to the cable and comprising a memory bus, wherein the memory is coupled to the memory bus.

11. A system according to claim 10, wherein the motherboard is to route the input/output signals to the cable and to route the power and ground signals to the interface elements.

* * * * *